(12) United States Patent
Ahn et al.

(10) Patent No.: US 12,140,286 B2
(45) Date of Patent: Nov. 12, 2024

(54) LIGHTING APPARATUS AND AUTOMOTIVE LAMP COMPRISING SAME

(71) Applicant: LG INNOTEK CO., LTD., Seoul (KR)

(72) Inventors: Kyoung Soo Ahn, Seoul (KR); Hyun Duck Yang, Seoul (KR); Young Min Moon, Seoul (KR); Kee Youn Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/279,466

(22) PCT Filed: Mar. 11, 2022

(86) PCT No.: PCT/KR2022/095050
§ 371 (c)(1),
(2) Date: Aug. 30, 2023

(87) PCT Pub. No.: WO2022/191682
PCT Pub. Date: Sep. 15, 2022

(65) Prior Publication Data
US 2024/0302016 A1    Sep. 12, 2024

(30) Foreign Application Priority Data

Mar. 11, 2021 (KR) .................. 10-2021-0032303

(51) Int. Cl.
*F21S 41/43* (2018.01)
*F21S 41/143* (2018.01)
(Continued)

(52) U.S. Cl.
CPC ............. *F21S 41/43* (2018.01); *F21S 41/143* (2018.01); *F21S 41/151* (2018.01);
(Continued)

(58) Field of Classification Search
CPC .......... F21S 41/43; F21S 41/322; F21S 41/36; F21S 41/143; F21S 41/151
See application file for complete search history.

(56) References Cited

U.S. PATENT DOCUMENTS 9,016,913 B2 * 4/2015 Englert .................. B60Q 1/323
362/23.05
9,741,700 B2   8/2017 Kim
(Continued)

FOREIGN PATENT DOCUMENTS

EP           2905530       8/2015
KR    10-2006-0052727      5/2006
(Continued)

OTHER PUBLICATIONS

International Search Report dated Jul. 4, 2022 issued in Application No. PCT/KR2022/095050.
(Continued)

*Primary Examiner* — Matthew J. Peerce
(74) *Attorney, Agent, or Firm* — KED & ASSOCIATES, LLP

(57) ABSTRACT

The lighting device disclosed in the embodiment of the invention includes a substrate; a plurality of light emitting devices disposed on the substrate and emitting light in at least a first direction; a resin layer sealing the plurality of light emitting devices; and an optical member disposed on the resin layer, wherein the resin layer may include a first light blocking portion integrally formed with the resin layer and having a transmittance lower than that of the resin layer on an emission-side region of each of the plurality of light emitting devices.

20 Claims, 9 Drawing Sheets

(51) Int. Cl.
  *F21S 41/151* (2018.01)
  *F21S 41/32* (2018.01)
  *F21S 41/36* (2018.01)
  *F21S 43/14* (2018.01)
  *F21S 43/20* (2018.01)
  *F21S 43/31* (2018.01)
  *F21Y 113/17* (2016.01)

(52) U.S. Cl.
  CPC ............ *F21S 41/322* (2018.01); *F21S 41/36* (2018.01); *F21S 43/14* (2018.01); *F21S 43/28135* (2024.05); *F21S 43/315* (2018.01); *F21Y 2113/17* (2016.08)

(56) References Cited

U.S. PATENT DOCUMENTS

| | | | |
|---|---|---|---|
| 9,921,411 | B2 | 3/2018 | Lee et al. |
| 10,957,825 | B2 | 3/2021 | Han et al. |
| 11,164,993 | B2 | 11/2021 | Kang et al. |
| 2010/0061096 | A1 | 3/2010 | Sato |
| 2014/0376233 | A1* | 12/2014 | Park ........................ F21S 43/31 362/296.04 |
| 2015/0219908 | A1 | 8/2015 | Lee et al. |
| 2016/0284674 | A1 | 9/2016 | Kim |
| 2017/0254518 | A1 | 9/2017 | Vasylyev |
| 2021/0262621 | A1 | 8/2021 | Eom |
| 2022/0246807 | A1 | 8/2022 | Chae et al. |

FOREIGN PATENT DOCUMENTS

| | | | | |
|---|---|---|---|---|
| KR | 10-2012-0055897 | | 6/2012 | |
| KR | 10-2014-0059448 | | 5/2014 | |
| KR | 10-2014-0145412 | | 12/2014 | |
| KR | 10-2016-0114209 | | 10/2016 | |
| KR | 10-2018-0028682 | | 3/2018 | |
| KR | 2018028682 | A * | 3/2018 | ............... F21K 9/00 |
| KR | 10-2019-0035491 | | 4/2019 | |
| KR | 10-2019-0054605 | | 5/2019 | |
| KR | 10-2019-0098641 | | 8/2019 | |
| KR | 10-2019-0143054 | | 12/2019 | |
| WO | WO 2021/010630 | | 1/2021 | |

OTHER PUBLICATIONS

European Search Report dated Jul. 19, 2024 issued in Application No. 22767578.2.

* cited by examiner

LIGHTING APPARATUS AND AUTOMOTIVE LAMP COMPRISING SAME

CROSS-REFERENCE TO RELATED PATENT APPLICATIONS

This application is a U.S. National Stage Application under 35 U.S.C. § 371 of PCT Application No. PCT/KR2022/095050, filed Mar. 11, 2022, which claims priority to Korean Patent Application No. 10-2021-0032303, filed Mar. 11, 2021, whose entire disclosures are hereby incorporated by reference.

TECHNICAL FIELD

An embodiment of the invention relates to a lighting device providing surface light. An embodiment of the invention relates to a light unit or vehicle lamp having a lighting device.

BACKGROUND ART

The light emitting diodes (LEDs) have advantages over conventional light sources such as fluorescent lamps and incandescent lamps, such as low power consumption, semi-permanent lifespan, fast response speed, safety, and environmental friendliness. Such light emitting diodes are applied to various lighting devices such as various display devices and indoor or outdoor lights. Recently, a lamp employing a light emitting diode has been proposed as a light source for vehicles. Compared with incandescent lamps, light emitting diodes are advantageous in that power consumption is small. In addition, since the size of the light emitting diode is small, the design freedom of the lamp may be increased, and the light emitting diode is economical due to its semi-permanent lifespan.

DISCLOSURE

Technical Problem

An embodiment of the invention may provide a lighting device that provides surface light to a surface of a resin layer sealing a light emitting device. An embodiment of the invention may provide a lighting device having a light blocking portion in a resin layer sealing a light emitting device. An embodiment of the invention may provide a lighting device having the light emitting device and a light blocking portion facing the light emitting device in a resin layer. An embodiment of the invention may provide a lighting device in which light blocking portions are disposed at different regions or/and different heights in a resin layer sealing a light emitting device. An embodiment of the invention may provide a light unit having a lighting device, a display device, or a vehicle lamp.

Technical Solution

A lighting device according to embodiment of the invention includes a substrate; a plurality of light emitting devices disposed on the substrate and emitting light in at least a first direction; a resin layer sealing the plurality of light emitting devices; and an optical member disposed on the resin layer, wherein the resin layer may include a first light blocking portion integrally formed with the resin layer and having a transmittance lower than that of the resin layer on an emission-side region of each of the plurality of light emitting devices. According to an embodiment of the invention, the first light blocking portion may have an area larger than an area of the light emitting device on a region facing to the emission surface of each of the light emitting devices. According to an embodiment of the invention, the resin layer includes a second light blocking portion disposed on a region that does not overlap with the light emitting device and the first light blocking portion in a vertical direction, and an upper surface of the second light blocking portion is exposed on an upper surface of the resin layer. According to an embodiment of the invention, the optical member may include a third light blocking portion disposed on a region that does not overlap with the light emitting device and the first light blocking portion in a vertical direction. According to an embodiment of the invention, a reflective member disposed between the substrate and the resin layer may be included, and the resin layer may include a fourth light blocking portion disposed around the light emitting devices. According to an embodiment of the invention, the optical member is a reflective layer, the resin layer is disposed between the reflective layer and the reflective member, the first light blocking portion is disposed between an emission surface of the light emitting device and a side surface of the resin layer, and each of the substrate, the resin layer, and the reflective layer may have a plurality of convex portions in which the emission-side region of each of the light emitting devices is convex outward.

According to an embodiment of the invention, the first light blocking portion is exposed on the upper surface of the resin layer, at least a portion of the first light blocking portion overlaps each of the light emitting devices in the vertical direction, and the first light blocking portion may include a first region extending from each of the light emitting devices in a direction toward the emission side of each of the light emitting devices, and a second region extending in a second direction on both sides of the first region. According to an embodiment of the invention, the first light blocking portion has a transmittance of 50% or less for light emitted from the light emitting device, and a difference between transmittance and reflectance of the first light blocking portion may be in a range of 1% to 30%. According to an embodiment of the invention, the first light blocking portion may be made of a white resin material. According to an embodiment of the invention, the first light blocking portion may be formed of the same resin material as that of the resin layer. According to an embodiment of the invention, the first light blocking portion has a thickness of a region disposed on the same straight line as a center of the light emitting device, which is thicker than a thickness of an outer region, and the optical member may include at least one of a diffusion agent, a phosphor, and ink particles.

Advantageous Effects

According to an embodiment of the invention, since the light shielding portion having a pattern is disposed in the resin layer, a process of printing a separate light-shielding pattern on the surface of an optical member disposed on the resin layer may be removed, and the resin layer itself may have a light-shielding effect. According to an embodiment of the invention, a thickness of the resin layer may be reduced, and a thickness of the module having the resin layer may be reduced. Optical reliability of a lighting module according to an embodiment of the invention and a lighting device having

DESCRIPTION OF DRAWINGS

FIG. 1b (A) to (C) are views illustrating a process of forming the light blocking portion of FIG. 1a.

FIG. 2 is a first modified example of the lighting device of FIG. 1a.

FIG. 3 is a second modified example of the lighting device of FIG. 1a.

FIG. 4 is a third modified example of the lighting device of FIG. 1a.

FIG. 5 is a fourth modified example of the lighting device of FIG. 1a.

FIG. 6 is a fifth modified example of the lighting device of FIG. 1a.

FIG. 10b is an A-A cross-sectional view of the lighting device of FIG. 10a.

BEST MODE

Hereinafter, preferred embodiments of the invention will be described in detail with reference to the accompanying drawings. A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

First Embodiment

Figure 1A:
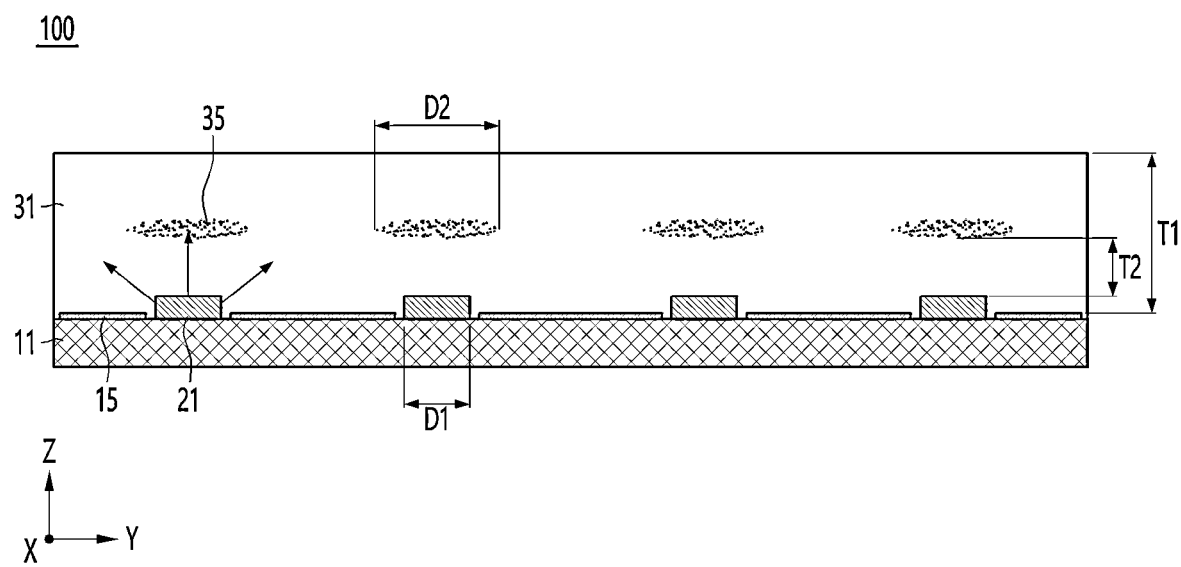
FIG. 1a is a side cross-sectional view showing a lighting device according to a first embodiment of the invention.
Figure 1B:
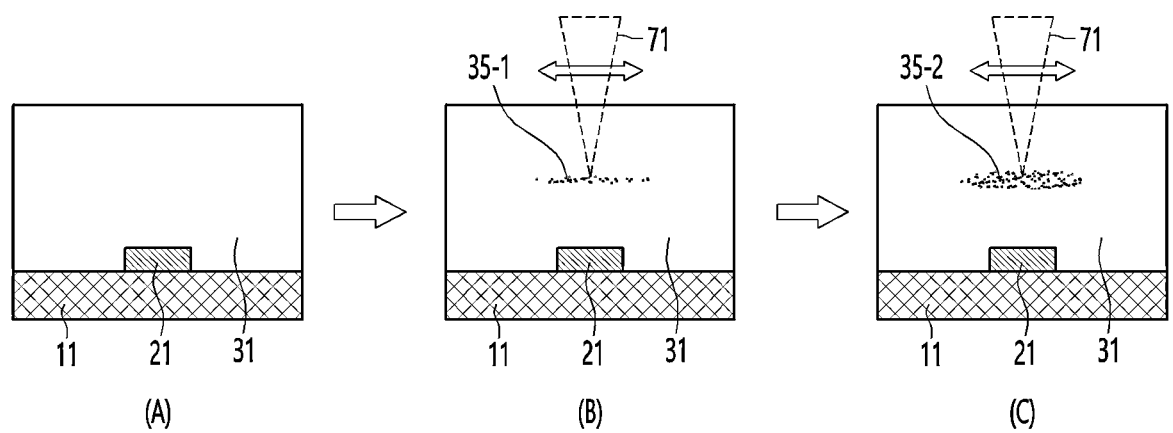

FIG. 1a is a side cross-sectional view of a lighting device according to a first embodiment of the invention, FIG. 1b is a view showing a process of forming a light blocking portion of FIG. 1a, and FIGS. 2 to 7 are modified examples of the lighting device of FIG. 1a.

Figure 2:
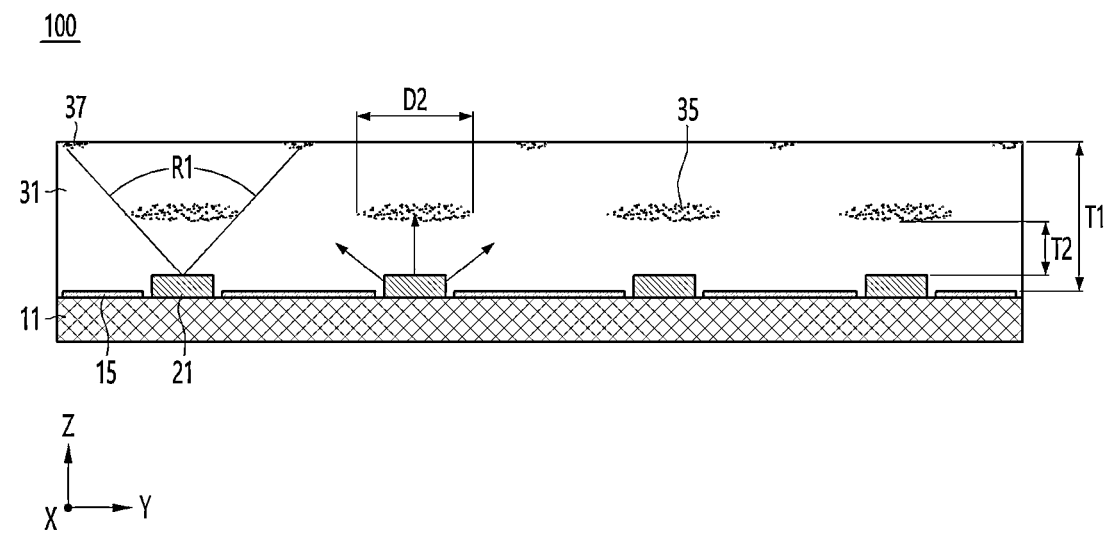
Figure 3:
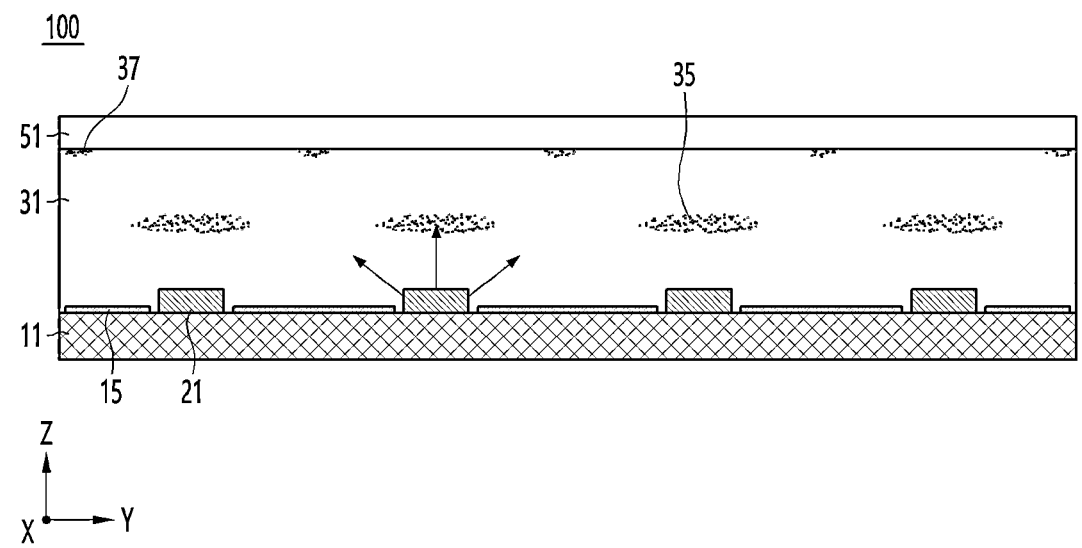

Referring to FIGS. 1a and 2, the lighting device 100 according to an embodiment of the invention includes a substrate 11, a light emitting device 21 disposed on the substrate 11, and a resin layer 31 disposed on the substrate 11 and sealing the light emitting device 21. The resin layer 31 may include a first light blocking portion 35 therein. The lighting device 100 may include a reflective member 15 disposed on an upper surface of the substrate 11. The reflective member 15 may be disposed between the substrate 11 and the resin layer 31 and reflect incident light. As shown in FIG. 3, the lighting device may include an optical member 51 at an upper portion of the resin layer 31.

The lighting device 100 may emit the light emitted from the light emitting devices 21 as surface light. A plurality of light emitting devices 21 may be disposed on the substrate 11, and the light emitting devices 21 may be arranged in one or more rows and one or more columns. The light emitting devices 21 may be arranged in n rows and m columns (n, m is 2 or more). The lighting device 100 may be applied to various lamp devices that require lighting, such as vehicle lamps, household lighting devices, and industrial lighting devices. For example, in the case of lighting modules applied to vehicle lamps, it is applicable to head lamps, side lights, side mirror lights, fog lights, tail lights, turn signal lamps, back up lamps, stop lamps, daytime running right, vehicle interior lighting, door scarf, rear combination lamp, backup lamp, etc.

The substrate 11 may function as a base member or a support member located below the light emitting device 21 and the resin layer 31. The substrate 11 includes a printed circuit board (PCB). The substrate 11 may include, for example, at least one of a resin-based printed circuit board (PCB), a metal core PCB, a flexible PCB, a ceramic PCB, or an FR-4 substrate. The substrate 11 may include, for example, a flexible PCB or a rigid PCB. The upper surface of the substrate 11 has an X-axis-Y-axis plane, and the thickness of the substrate 11 may be a height in a Z direction orthogonal to the X and Y directions. Here, the X direction may be a first direction, the Y direction may be a second direction orthogonal to the X direction, and the Z direction may be a third direction orthogonal to the X and Y directions.

The substrate 11 includes a wiring layer (not shown) thereon, and the wiring layer may be electrically connected to the light emitting devices 21. The light emitting devices 21 may be connected in series, parallel, or series-parallel by the wiring layer of the substrate 11. A group of two or more of the light emitting devices 21 may be connected in series or parallel, or the groups may be connected in series or parallel. The substrate 11 may have a thickness of 0.5 μmm or less, for example, in the range of 0.3 μmm to 0.5 μmm. Since the thickness of the substrate 11 is thin, it is possible to support a flexible module without increasing the thickness of the lighting module.

The substrate 11 may have a top view shape of a rectangle, a square, or another polygonal shape, and may have a bar shape having a curved shape. The substrate 11 may include a protective layer or a reflective layer thereon. The protective layer or the reflective layer may include a member made of a solder resist material, and the solder resist material is a white material and may reflect incident light. As another example, the substrate 11 may include a transparent material. Since the substrate 11 made of the transparent material is provided, the light emitted from the light emitting device 21 may be emitted toward the upper and lower surfaces of the substrate 11.

The light emitting device 21 may be disposed on the substrate 11 and sealed by the resin layer 31. The plurality of light emitting devices 21 may be in contact with the resin layer 31. The resin layer 31 may be disposed on a side surface and an upper surface of the light emitting device 21. The resin layer 31 seals the light emitting devices 21 and may contact the upper surface of the substrate 11 or/and the reflective member 15. Light emitted from the light emitting device 21 may be emitted through the resin layer 31. The light emitting device 21 may emit light through at least five sides. That is, the light emitting device 21 is an LED chip that emits light on five sides and may be disposed on the substrate 11 in a flip chip form. As another example, the light emitting device 21 may be implemented as a horizontal chip or a vertical chip. A distance between the light emitting devices 21 may be equal to or greater than a thickness of the resin layer 31. The distance may be, for example, 2.5 μmm or more, and may vary depending on the size of the LED chip. Since the light emitting device 21 is provided as a flip chip that emits light on at least five sides, the luminance distribution and the beam angle distribution of the light emitting device 21 may be improved, and a dark part may not be generated. In addition, the beam angle distribution of the light emitting device 21 may be provided as 130 degrees or more.

The light emitting device 21 is a LED chip, and may emit at least one of blue, red, green, ultraviolet (UV), or infrared light. The light emitting device 21 may emit at least one of blue, red, and green, for example. The surface of the light emitting device 21 may be sealed with a transparent insulating layer or resin, but is not limited thereto. A phosphor layer having a phosphor may be formed on a surface of the light emitting device 21. A support member having a ceramic support member or a metal plate may be disposed under the LED chip of the light emitting device 21, and the support member may be used as an electrical and thermal conduction member.

The resin layer 31 is disposed on the substrate 11 and seals the light emitting device 21. The resin layer 31 may be made of a transparent resin material, such as UV resin, silicone, epoxy, or PET (polyethylene terephthalate). The resin layer 31 may be a layer made of a transparent material to which impurities are not added. Since the resin layer 31 is free of impurities, light may be transmitted with straightness. As another example, the resin layer 31 may include a diffusion agent therein.

The resin layer 31 may have a thickness T1 greater than the thickness of the light emitting device 21. A thickness T1 of the resin layer 31 may be greater than that of the substrate 11. The thickness T1 of the resin layer 31 may be 5 times or more, for example, 5 times to 9 times thicker than the thickness of the substrate 11. Since the resin layer 31 is disposed to have the thickness T1 described above, it is possible to seal the light emitting device 21 on the substrate 11, prevent penetration of moisture, and support the substrate 11. The resin layer 31 and the substrate 11 may be flexible plates. The thickness T1 of the resin layer 31 may be 2.7 μmm or less, for example, in the range of 2 μmm to 2.7 μmm. When the thickness T1 of the resin layer 31 is less than the above range, the distance between the light emitting device 21 and the optical member 51 (see FIG. 3) may be reduced or the thickness of the diffusion layer may be increased. When it is larger the above range, the module thickness may increase or the light intensity may decrease.

The resin layer 31 is disposed between the substrate 11 and the optical member 51, guides the light emitted from the light emitting device 21, and emits it upward. The light emitting device 21 may emit, for example, blue light or red light.

In an embodiment of the invention, the resin layer 31 may include one or a plurality of first light blocking portions 35 therein. The first light blocking portion 35 may be formed of the same resin material as the resin layer 31. The first light blocking portion 35 may be integrally formed within the resin layer 31 without an interface with the resin layer 31. To this end, the first light blocking portion 35 may be a discolored region within the resin layer 31, for example, a discolored white region. The first light blocking portion 35 may be formed of a material having a higher refractive index than that of the resin material of the resin layer 31. The transmittance of the first light blocking portion 35 may be lower than that of the resin layer 31. The first light blocking portion 35 may have transmittance of 50% or less, for example, in the range of 1% to 50%, or in the range of 3% to 46% with respect to the light emitted from the light emitting device 21. The first light blocking portion 35 may have a reflectance of 10% or more, for example, in a range of 10% to 25% with respect to light emitted from the light emitting device 21. A difference between transmittance and reflectance in the first light blocking portion 35 may be disposed in a range of 30% or less, for example, 1% to 30%.

The first light blocking portion 35 may be disposed between the upper and lower surfaces of the resin layer 31. The plurality of first light blocking portions 35 may be disposed in different regions of the resin layer 31. For example, each of the first light blocking portions 35 may be disposed in a region overlapping each of the light emitting devices 21 in the third direction Z in the resin layer 31. The width D2 of each of the first light blocking portions 35 in the first direction or/and the second direction may be wider than the width D1 of each of the light emitting devices 21, for example, in the range of 101% to 300% or in the range of 101% to 250% of the width D1. In the first light blocking portion 35, a region disposed on a same straight line as the center of the light emitting device 21 may have the thickest thickness, and a region outside the edge of the light emitting device 21 may have the thinnest thickness. That is, the thickness of the first light blocking portion 35 may be a thick in a region closest to the center of the light emitting device 21 and may be a thinner in a farther region.

The first light blocking portion 35 has a larger upper surface area than the upper surface area of the light emitting device 21, and blocks light incident from the light emitting device 21. Accordingly, hot spots caused by light emitted from the light emitting device 21 may be reduced by the first light blocking portion 35. The separation distance T2 between the first light blocking portion 35 and the light emitting device 21 may be formed in a range of 30% or more, for example, 30% to 80% of the thickness T1 of the resin layer 31. In the first light blocking portion 35, an angle between a straight line (optical axis) perpendicular to the center of the light emitting device 21 and a straight line passing through the edge of the first light blocking portion 35 may cover a range of 45 degrees or more, for example, in a range of 46 degrees to 70%. Accordingly, the first light blocking portion 35 may have a narrower width D2 or a smaller area as it is closer to the light emitting device 21, and have a wider width D2 or a larger area as it is farther from the light emitting device 21. That is, the first light blocking portion 35 may have a wider width or larger area in a region closer to the upper surface of the resin layer 31 from the light emitting device 21.

As another example, the lighting device 100 may include a plurality of resin layers on the light emitting device 21 and the substrate 11. The plurality of resin layers may include, for example, two or more layers or three or more layers. The plurality of resin layers may selectively include at least two or three layers among a layer without impurities, a layer containing a phosphor, a layer containing a diffusion agent, and a layer containing a phosphor/diffusion material. At least one of the plurality of resin layers may selectively include at least one of a diffusion agent, a phosphor, and ink particles. That is, the phosphor and the diffusing agent may be added to separate resin layers or may be mixed with each other and disposed in one resin layer. The impurities may include phosphors, diffusion agents, or ink particles. Layers each including the phosphor and the diffusion agent may be disposed adjacent to each other or may be disposed apart from each other. When the layer on which the phosphor and the diffusion agent are disposed are separated from each other, the layer on which the phosphor is disposed may be disposed above the layer on which the diffusion agent is disposed. The phosphor and the ink particles may be disposed on the same layer or on different layers. The resin layer to which the grain particles are added may be disposed higher than the resin layer to which the phosphor is added.

The phosphor may include at least one of a blue phosphor, a green phosphor, a red phosphor, an amber phosphor, and a yellow phosphor. The size of the phosphor may range from 1 μm to 100 μm. The higher the density of the phosphor, the higher the wavelength conversion efficiency, but since the light intensity may be lowered, it may be added in consideration of the light efficiency within the above size. The diffusion agent may include at least one of PMMA (Poly Methyl Meth Acrylate) series, $TiO_2$, $SiO_2$, $Al_2O_3$, and silicon series. The diffusing agent may have a refractive index in the range of 1.4 to 2 at the emission wavelength and a size in the range of 1 μm to 100 μm. The diffusing agent may have a spherical shape, but is not limited thereto. For example, the diffuser may have a light uniformity of 90% or more when the refractive index is 1.4 or more, or a light uniformity of 90% or more when the size is in the range of 1 μm to 30 μm. The light uniformity is the light uniformity on the region where the light emitting devices are connected to each other, and may be provided as 90% or more.

The ink particles may include at least one of metal ink, UV ink, and curing ink. A size of the ink particle may be smaller than a size of the phosphor. The surface color of the ink particle may be any one of green, red, yellow, and blue. The ink types may be selectively applied among PVC (Poly vinyl chloride) ink, PC (Polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink and PS (Polystyrene) ink. Here, the width or diameter of the ink particle may be 5 μm or less, for example, in the range of 0.05 μm to 1 μm. At least one of the ink particles may be smaller than the wavelength of light. The color of the ink particles may include at least one of red, green, yellow, and blue. For example, the phosphor emits a red wavelength, and the ink particles may include red. For example, the red color of the ink particles may be darker than the color of the phosphor or the wavelength of light. The ink particles may have a color different from that of the light emitted from the light emitting device. The ink particles may give an effect of blocking or blocking incident light.

Figure 11:
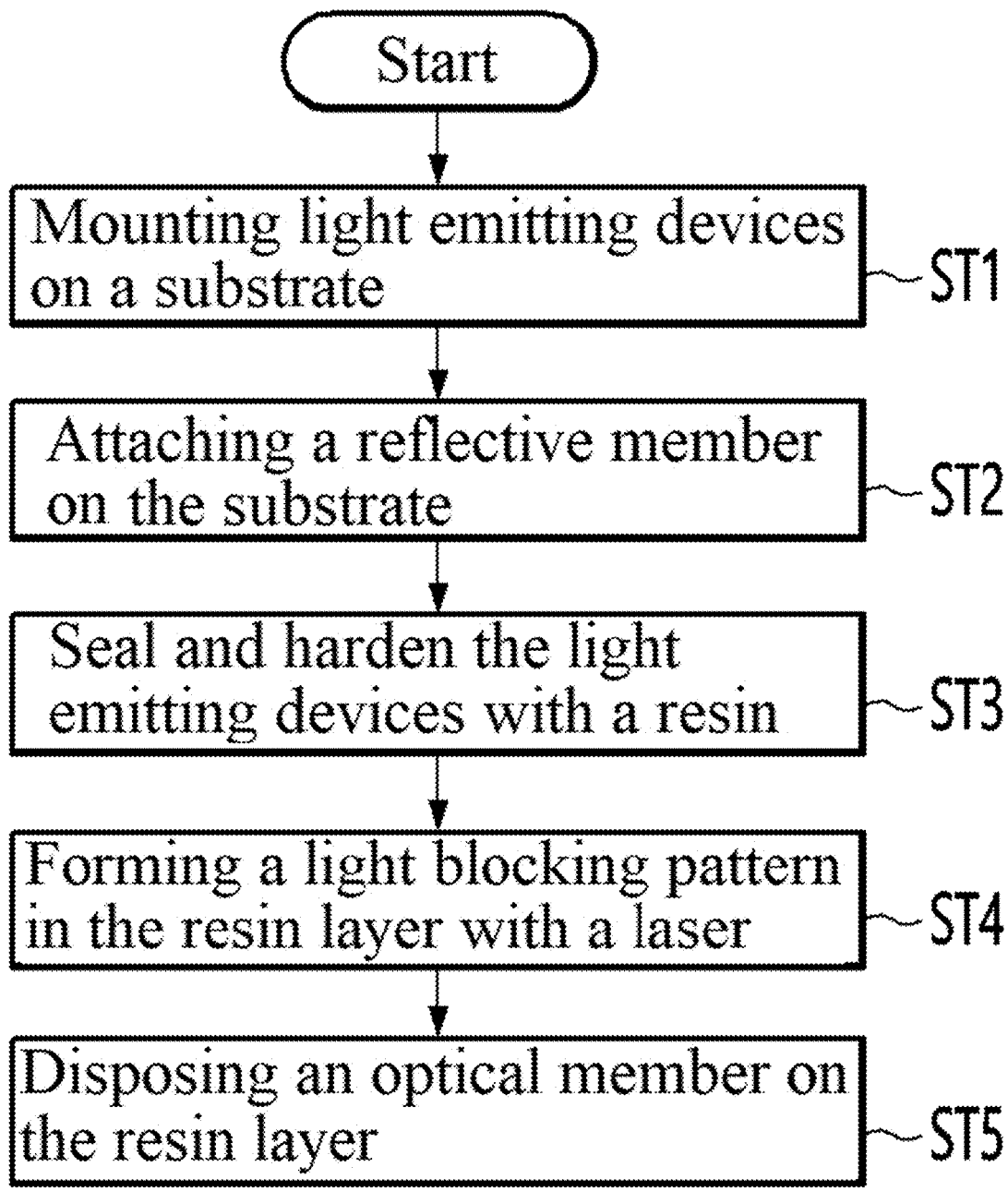
FIG. 11 is a flowchart illustrating a process of forming a lighting device according to an embodiment of the invention.

As shown in FIGS. 1b and 11, the light emitting device 21 is mounted on the substrate 11 (ST1), and a reflective member 15 penetrating the light emitting device 21 is attached to the substrate 11 (ST2), the light emitting devices 21 on the substrate 11 are sealed with resin and cured to form a resin layer 31 (ST3), and a laser 71 is applied on the resin layer 31 at a predetermined wavelength and a predetermined intensity on the resin layer 31 to focus in the resin layer 31. At this time, the focused region 35-1 may be discolored, and this process may be repeated to form the pattern region 35-2 of the first light blocking portion 35 (ST4). An adhesive or non-adhesive optical member may be formed on the resin layer 31 (ST5). The pattern shape of the first light blocking portion 35 may be a shape in which dot patterns or line patterns are distributed on the light emitting device. Here, the laser 71 may use at least one of YAG, YLF, $YVO_4$, ruby, glass gas laser (e.g., $CO_2$ laser), Ar laser, and excimer laser with a wavelength of 400 nm or more. The irradiation condition of the laser has an output of 0.7 kW or more, pulse oscillation of a frequency of 10 kHz, and the scanning speed may be irradiated while repeatedly scanning at 700 μmm/sec.

Figure 12:
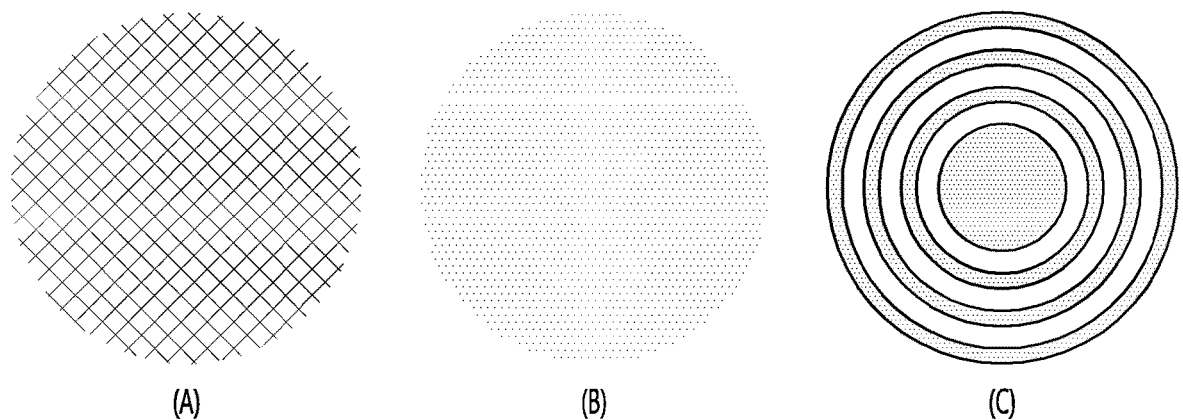
FIGS. 12 (A) to (C) are examples of an external pattern of a light blocking portion according to an embodiment of the invention.
Figure 13:
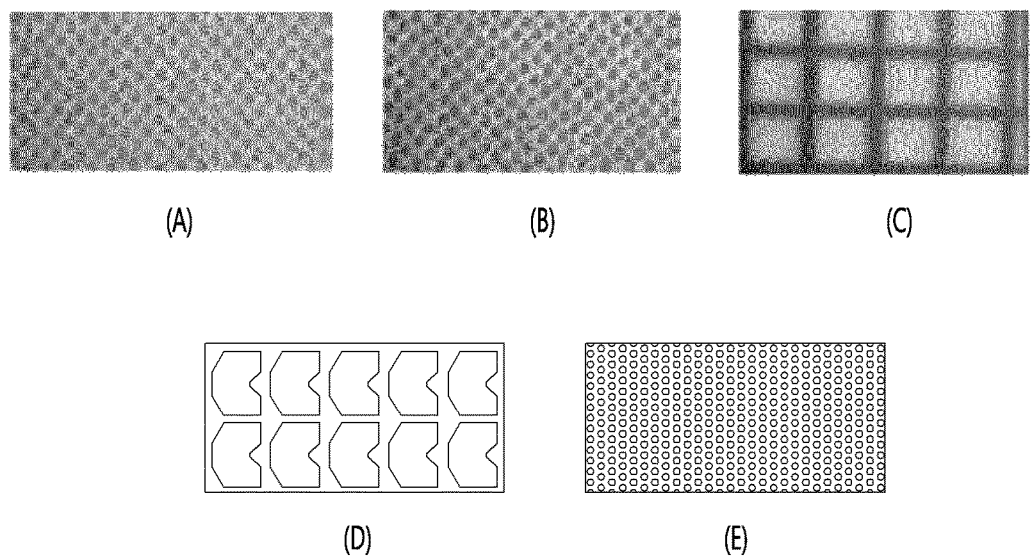
FIGS. 13 (A) to (E) are examples of a detailed pattern of a light blocking portion according to an embodiment of the invention.

As shown in FIG. 12, the pattern shape of the first light blocking portion is a grid pattern of lines formed in a circular shape (FIG. 12(A)), dot patterns formed in a circular shape (FIG. 12(B)), or ring-shaped regions having a dot or line pattern may be concentrically arranged (FIG. 12(C)). As shown in FIG. 13, each of the enlarged patterns of the first light blocking portion may include inverse patterns A and B, grid patterns C, and matrix patterns D and E of non-uniform sizes.

Table 1 shows the transmittance and reflectance of the patterns (A)-(E) of the first light blocking portion shown in FIG. 13 and FIG. 12 compared with those of Comparative example. The comparative example has a structure without a pattern such as the first light blocking portion in the resin layer.

TABLE 1

|  | Transmittance | Reflectance |
|---|---|---|
| Comparative Example | 85.53% | 11.44% |
| Pattern A | 45.59% | 11.27% |
| Pattern B | 29.54% | 11.90% |
| Pattern C | 41.81% | 15.09% |
| Pattern D | 12.09% | 13.95% |
| Pattern E | 3.74% | 20.38% |

As shown in Table 1, as the transmittance and reflectance of the first light blocking portion at a wavelength of 617 nm, it may be seen that the transmittance of the structure of the patterns (A)-(E) is reduced to 50% or less than the comparative example, and the reflectance may be similar to or higher than that of the comparative example. The first light blocking portion may be disposed in a range of 30% or less, for example, 1% to 30%, between transmittance and reflectance. Accordingly, the first light blocking portion may significantly reduce the transmittance of the resin layer 31 by the selected region among the patterns (A)-(E) and improve the light blocking effect by diffusion.

As shown in FIG. 2, the lighting device 100 may include a first light blocking portion 35 in the resin layer 31 and a second light blocking portion 37 on the surface of the resin layer 31. The first light blocking portions 35 may be disposed between the upper surface of the resin layer 31 and each of the light emitting devices 21, respectively. The first light blocking portion 35 will refer to the description disclosed above, and the second light blocking portion 37 may be exposed on the upper surface of the resin layer 31 or may be the same plane as the upper surface of the resin layer 31. The second light blocking portion 37 may be formed in the same conditions as the formation conditions of the first light blocking portion 35, and focus and distribute the light in a region close to the surface of the resin layer 31.

The second light blocking portion 37 may be formed in a ring shape around an outer circumference of the first light blocking portion 35. Regions of the second light blocking portion 37 may be spaced apart from the center of the light emitting device 21 at a beam angle R1, for example, 120 degrees or more. That is, the distance between the outer lines of the second light blocking portion 37 may be formed in the range of an angle R1 of 120 degrees to 140 degrees with respect to the light emitting device 21. Accordingly, the second light blocking portion 37 may be formed along an outer line of a beam angle at which the intensity of light emitted through the light emitting device 11 is greatest. The second light blocking portion 37 may have transmittance of 50% or less, for example, in the range of 1% to 50%, or in the range of 3% to 46% with respect to the light emitted from the light emitting device 21. The second light blocking portion 37 may be disposed so that the difference between transmittance and reflectance is 30% or less, for example, 1% to 30%. Accordingly, the second light blocking portion 37 may effectively block light from a region of relatively high light intensity on the surface of the resin layer 31.

The second light blocking portion 37 may have a ring shape in a top view, and an upper surface portion of the resin layer 31 may be exposed between or inside the pattern of the second light blocking portion 37. The second light blocking portion 37 may be disposed on a region that does not overlap with the light emitting device 21 and the first light blocking portion 35 in the vertical direction Z. The second light blocking portion 37 may be formed of the same resin material as the resin layer 31. The second light blocking portion 37 may be integrally formed within the resin layer 31 without an interface with the resin layer 31. The second light blocking portion 37 may be a discolored region in the resin layer 31, for example, a discolored white region. The second light blocking portion 37 may be formed of a material having a higher refractive index than that of the resin material of the resin layer 31.

The second light blocking portion 37 may have a pattern width smaller than that of the first light blocking portion 35 and may be disposed in a region that does not overlap with the first light blocking portion 35 in a vertical direction. The second light blocking portion 37 may be exposed on the surface of the resin layer 31 and may have a thickness smaller than the maximum thickness of the first light blocking portion 35. Therefore, since the first and second light blocking portions 35 and 37 are disposed at different heights within the resin layer 31 based on the light emitting device 21, they may block the light, suppress hot sports, and provide a uniform surface light distribution.

As shown in FIG. 3, in the lighting device 100, an optical member 51 may be disposed on the surface of the resin layer 31. The optical member 51 may be attached to or separated from the upper surface of the resin layer 31. The optical member 51 may be a resin layer having at least one or two or more of a diffusion agent, a phosphor, and ink particles. The resin layer 31 may include the first light blocking portion 35 on each upper portion of the light emitting device 21, or may include the first light blocking portion 35 and the second light blocking portion 37 described above. When the second light blocking portion 37 is exposed on the surface of the resin layer 31, the second light blocking portion 37 may face or adhere to the lower surface of the optical member 51.

The content of the diffusion agent added to the optical member 51 may be in the range of 2 wt % to 5 wt % in the material of the resin material. When the content of the diffusing agent is less than the above range, there is a limit to reducing the hot spot, and when it is greater than the above range, light transmittance may be reduced. Accordingly, the diffusing agent can diffuse light to reduce hot spots without reducing light transmittance. The diffusion agent may include at least one of PMMA (Poly Methyl Meth Acrylate) series, $TiO_2$, $SiO_2$, $Al_2O_3$, and silicon series.

When the optical member 51 has a phosphor inside, the content of the phosphor is added in the same amount as that of the resin material constituting the optical member 51, or may be added in a ratio of 40% to 60% compared to 40% to 60% of the resin material of the optical member 51. The phosphor may include at least one of a red phosphor and a yellow phosphor.

When the optical member 51 has ink particles therein, the ink particles may include at least one of metal ink, UV ink, and hardening ink. Types of the ink particles may be selectively applied among PVC (Poly vinyl chloride) ink, PC (Polycarbonate) ink, ABS (acrylonitrile butadiene styrene copolymer) ink, UV resin ink, epoxy ink, silicone ink, PP (polypropylene) ink, water-based ink, and plastic ink., PMMA (poly methyl methacrylate) ink, PS (Polystyrene) ink. Here, the width or diameter of the ink particle may be 5 μm or less, or may range from 0.05 μm to 1 μm. At least one of the ink particles may be smaller than the wavelength of light. The ink particles may include at least one of metal ink, UV ink, and curing ink. A size of the ink particle may be smaller than a size of the phosphor. At least one of the ink particles may be smaller than the wavelength of light. The surface color of the ink particle may be any one of green, red, yellow, and blue.

The inside of the optical member 51 may contain phosphor and ink particles without a diffusing agent. In this case, the phosphor emits a red wavelength, and the ink particles may include red. For example, the red color of the ink particles may be darker than the color of the phosphor or the wavelength of light. The ink particles may have a color different from that of the light emitted from the light emitting device 21. The ink particles may give an effect of blocking or blocking incident light. In the optical member 51, the content of the phosphor may be added in a range of 23 wt % or less or 10 wt % to 23 wt %, and the ink particles may be added in a range of 12 wt % or less, for example, 4 wt % to 12 wt %. The content of the phosphor in the optical member 51 may be 3 wt % or more than the content of the ink particles, or may be added in a range of 3 wt % to 13 wt %. Since the weight of the ink particles is smaller than the weight of the phosphors, the ink particles may be distributed in a region closer to the surface of the resin layer than the phosphors. Accordingly, the color of the surface of the optical member 51 may be provided as the color of the ink particles. Light transmission may be suppressed by such ink particles, and hot spots may be reduced.

The optical member 51 may be attached to the surface of the resin layer 31 with an adhesive. The adhesive is a transparent material and may be an adhesive such as UV adhesive, silicone or epoxy. The optical member 51 may include at least one of a resin material, for example, silicon, epoxy, or polyester (PET). Here, the upper surface of the second light blocking portion 37 exposed to the upper surface of the resin layer 31 may be bonded to an adhesive bonded to the lower surface of the optical member 51.

Figure 4:
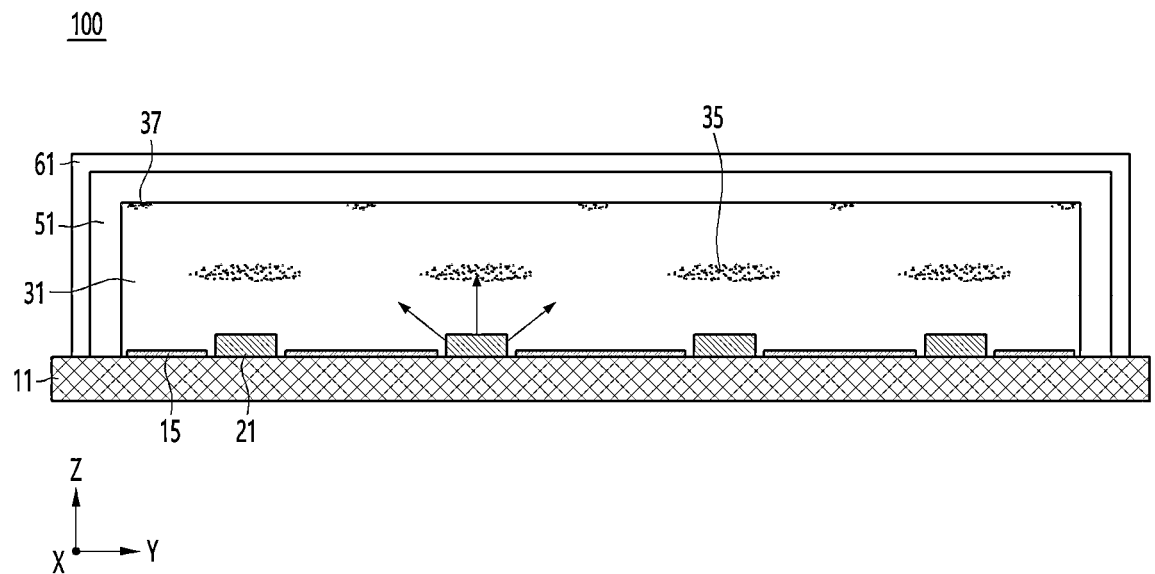

FIG. 4 is a modified example of FIG. 1a, and the lighting device 100 may include first and second light blocking portions 35 and 37 or the first light blocking portion 35 in the resin layer 31. A first optical member 51 on the surface of the resin layer 31 and a second optical member 61 on the surface of the first optical member 51 may be included. The first optical member 51 may include a diffusion agent therein, and the second optical member 61 may include a phosphor or/and ink particle therein. The first optical member 51 may extend from the upper surface of the resin layer 31 to the side surface, and an end portion thereof may contact the upper surface of the substrate 11 or/and the reflective member 15. The second optical member 61 may extend from the upper surface of the first optical member 51 to the side surface, and an end portion thereof may contact the upper surface of the substrate 11 or/and the reflective member 15. The first and second optical members 51 and 61 are respectively disposed on the upper and side portions of the resin layer 31 to emit incident light as surface light and provide surface colors in red and yellow colors. The first and second optical members 51 and 61 may be made of the same material or materials having different refractive indices. The first and second optical members 51 and 61 may include at least one of a resin material, for example, silicon, epoxy, or polyester (PET).

Figure 5:
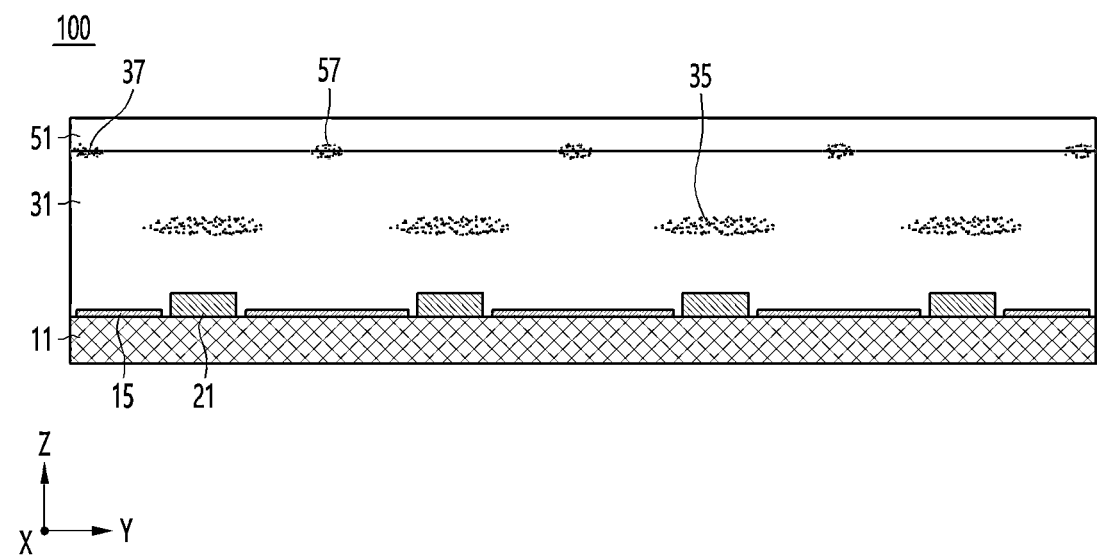

FIG. 5 is a modified example of FIG. 1a, and reference is made to the descriptions of FIGS. 1a and 3, and only a different configuration will be described.

Referring to FIG. 5, in the lighting device 100, an optical member 51 is disposed on a surface of a resin layer 31, and the optical member 51 may be a resin material having at least one or two or more types of a diffusion agent, a phosphor, and ink particles. The resin layer 31 may include the first light blocking portion 35 on each upper portion of the light emitting device 21, or may include the first light blocking portion 35 and the second light blocking portion 37 described above. When the second light blocking portion 37 is exposed on the surface of the resin layer 31, the second light blocking portion 37 may face or adhere to the lower surface of the optical member 51. Here, the optical member 51 may include a third light blocking portion 57. The third light blocking portion 57 may be made of the same material as that of the optical member 51. The third light blocking portion 57 may be a region in which a focused portion is discolored (e.g., white) by irradiating a laser beam from an upper portion of the optical member 51. The third light blocking portion 57 may be disposed so that the difference between transmittance and reflectance is 30% or less, for example, in a range of 1% to 30%. Accordingly, the third light blocking portion 57 may effectively block light from an area of relatively high light intensity on the surface of the optical member 51. As another example, the lighting device may provide a light blocking effect with the third light blocking portion 57 without the second light blocking portion 37.

The third light blocking portion 57 may be disposed in a region that does not overlap with the light emitting device 21 in a vertical direction. The third light blocking portion 57 may be disposed in a region overlapping or facing the second light blocking portion 37 in a vertical direction. The third light blocking portion 57 may have a ring shape and may be formed along a region facing the second light blocking portion 37. The third light blocking portion 57 may be exposed on a lower surface of the optical member 51. As another example, the third light blocking portion 57 may overlap the first and second light blocking portions 35 and 37 in a vertical direction.

Figure 6:
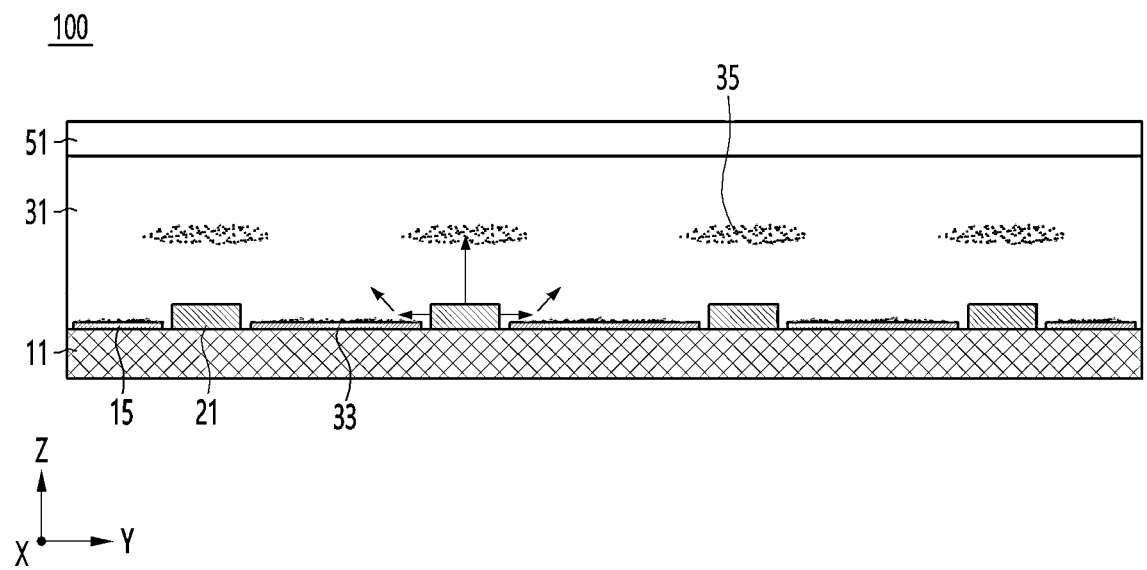

FIG. 6 is a modified example of the lighting module of FIG. 1a, and the lighting device 100 may include a fourth light blocking portion 33. The fourth light blocking portion 33 may be disposed on an upper surface of the reflective member 15. The fourth light blocking portion 33 may face the side surfaces of the light emitting device 21. The fourth light blocking portion 33 may be formed by discoloration of a resin material in the resin layer 31, and reflect or diffuse the light emitted from the side surfaces of the light emitting device 21 around the side surfaces of the light emitting device 21. The fourth light blocking portion 33 may function as a reflecting portion or a diffusing portion. The fourth light blocking portion 33 has an area larger than that of the first light blocking portion 35 and may have a thickness thinner than the maximum thickness of the first light blocking portion 35, for example, 50% or less than the maximum thickness of the first light blocking portion 35. Here, a second light blocking portion 37 may be further disposed in the resin layer 31 as shown in FIG. 2, or/and a third light blocking portion 57 may be further disposed on the lower surface of the optical member 51 as shown in FIG. 5.

Figure 7:
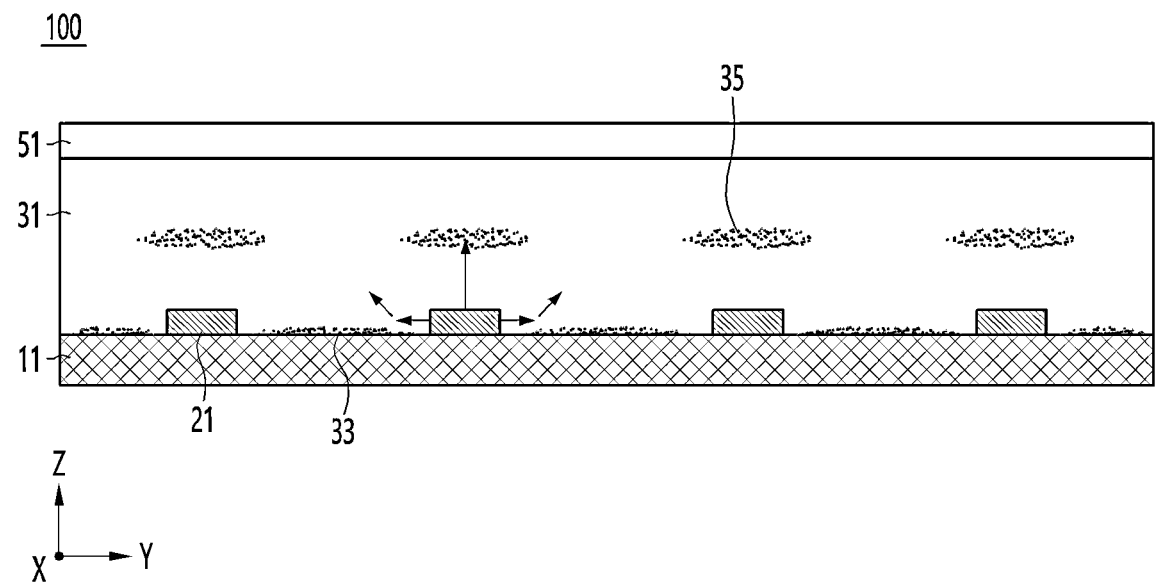
FIG. 7 is an example of the lighting device of FIG. 1a without a reflective member.

FIG. 7 is a modified example of the lighting module of FIG. 1a, and the lighting device 100 may include a fourth light blocking portion 33. The fourth light blocking portion 33 may be disposed on the upper surface of the substrate 11 when there is no reflective member. The fourth light blocking portion 33 may face the side surfaces of the light emitting device 21. The fourth light blocking portion 33 may be formed by discoloration of a resin material in the resin layer 31, and may reflect or diffuse the light emitted from the side surfaces of the light emitting device 21 around the side surfaces of the light emitting device 21. The fourth light blocking portion 33 may function as a reflecting portion or a diffusing portion. The fourth light blocking portion 33 has an area larger than that of the first light blocking portion 35 and may have a thickness thinner than the maximum thickness of the first light blocking portion 35, for example, 50% or less than the maximum thickness of the first light blocking portion 35.

Second Embodiment

Figure 8:
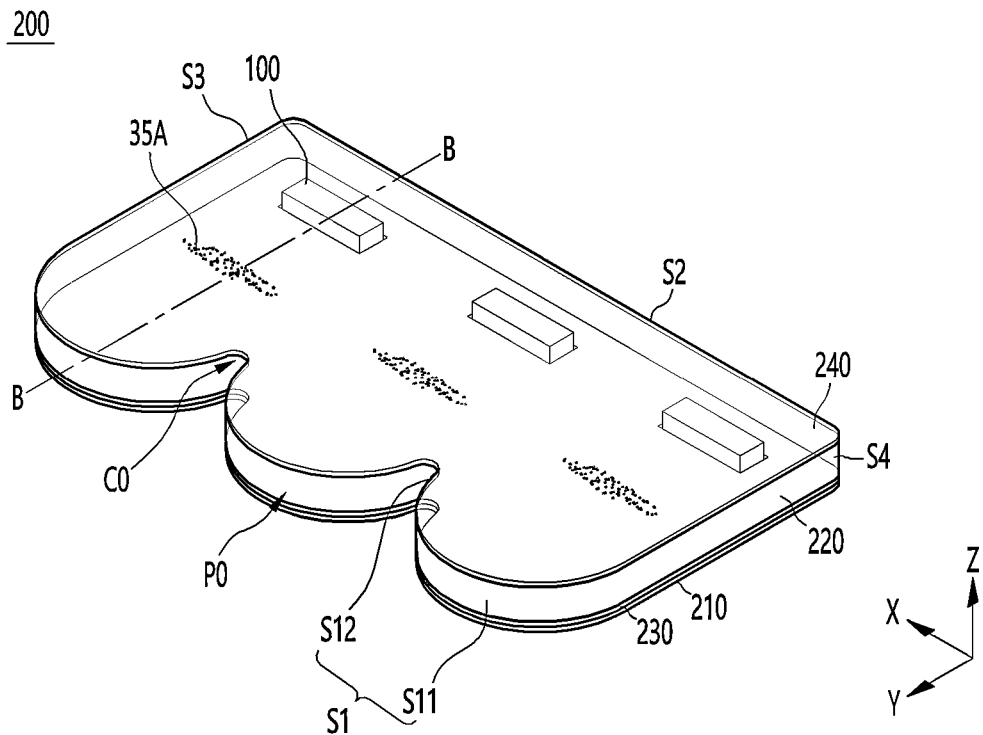
FIG. 8 is a perspective view illustrating a lighting device according to a second embodiment of the invention.
Figure 9:
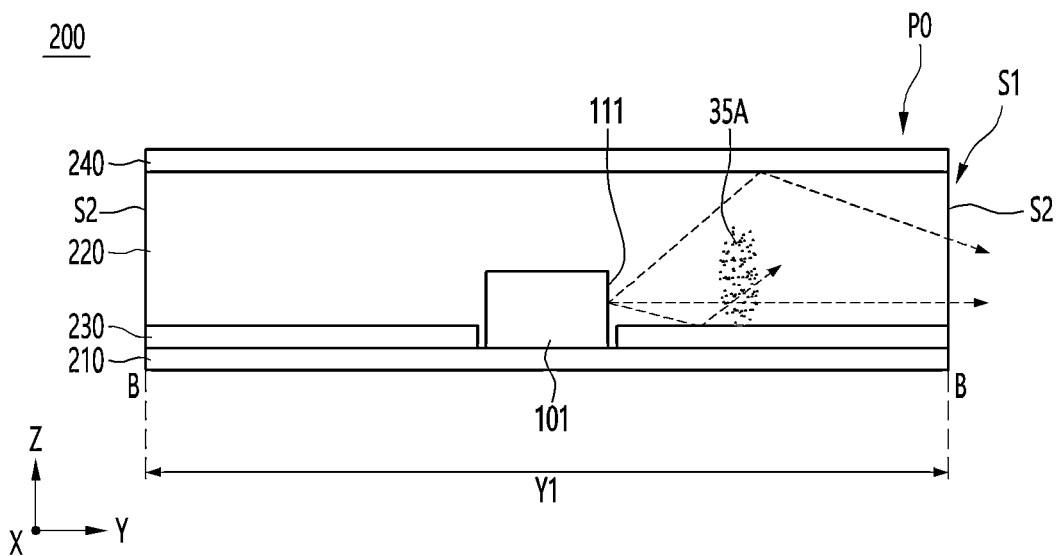
FIG. 9 is a B-B side sectional view of the lighting device of FIG. 8.

FIGS. 8 and 9 are views showing a lighting device according to a second embodiment of the invention.

Referring to FIGS. 8 and 9, the lighting device 200 includes a substrate 210, a plurality of light emitting devices 101 disposed on the substrate 210, a resin layer 220 disposed on the substrate 210 and the plurality of light emitting devices 101, a first reflective layer 240 disposed on the resin layer 220. The lighting device 200 may include a second reflective layer 230 between the substrate 210 and the resin layer 220.

A plurality of the light emitting devices 101 may be arranged in the second direction X or in a direction from the third surface S3 to the fourth surface S4. The light emitting devices 101 may be arranged in one row. As another example, two or more rows of the light emitting devices 101 may be arranged in different columns. The plurality of light emitting devices 101 may be arranged on a straight line or a curved line extending in the second direction X.

The maximum length of the lighting device 200 in the second direction X may be greater than the maximum length Y1 in the first direction Y. The lengths of the first and second directions Y and X may be greater than the thickness or height of the vertical direction Z. The maximum length Y1 of the first direction Y may be greater than or equal to 13 μmm, for example, in the range of 13 μmm to 25 μmm.

The light emitting device 101 may be disposed between first and second reflective layers 240 and 230 made of a reflective material facing each other in a vertical direction within the resin layer 220. The first reflective layer 240 may be an optical member made of a reflective material disposed on the resin layer 220, and the second reflective layer 230 may be a member made of a reflective material disposed below the resin layer 220. The light emitting device 101 may be disposed closer to the second reflective layer 230 than to the first reflective layer 240. Each side surface of the lighting device 200 may have the same thickness or the same height. The light emitting devices 101 may be sealed by a transparent resin material layer, and the resin material layer may be disposed between layers of a reflective material or disposed between a supporting member and a reflective layer or member.

The substrate 210 includes a printed circuit board (PCB), and the resin layer 220 is disposed on the substrate 210, and may be selected from materials of the substrate and the resin layer disclosed in FIG. 1.

The resin layer 220 may include first and second surfaces S1 and S2 disposed on opposite sides, and third and fourth surfaces S3 and S4 disposed on opposite sides. Each outer surface of the lighting device 200 may be each side surface of the resin layer 220 having the largest thickness in the lighting device 200. The outer surfaces S1, S2, S3, and S4 of the resin layer 220 may be disposed in a direction perpendicular to or in the same plane as each side surface of the substrate 210, the second reflective layer 230, and the first reflective layer 240. The first and second surfaces S1 and S2 may extend in the second direction Y from both ends of the third and fourth surfaces S3 and S4. The first surface S1 faces the second surface S1 and may include a curved surface. The first surface S1 is a surface in a direction in which light is emitted from the plurality of light emitting devices 101, and the second surface S2 may be a surface opposite to the direction in which light is emitted from the plurality of light emitting devices 101.

An emission surface 111 of each of the plurality of light emitting devices 101 may face the first surface S1. Light emitted from the light emitting devices 101 is emitted through the first surface S1, and some light may be emitted through at least one of the second surface S2, the third surface S3, and the fourth surface S4. That is, most of the light emitted from the light emitting device 101 may be emitted through the first surface S1. Accordingly, a line-shaped light source may be emitted through the first surface S1 of the resin layer 220. The thickness of the first surface S1 of the resin layer 220 is the thickness of the resin layer 220 and may be less than 3 μmm.

The first surface S1 of the resin layer 220 may be an emission surface from which light emitted from the light emitting device 101 is emitted. The first surface S1 may be a front surface or an emission surface, and the second surface S2 may be a rear surface or a non-emission surface. The first surface S1 may extend in a vertical direction and have a structure having a convex portion P0 and a recess portion CO along the second direction Y. The first surface S1 may include a plurality of convex surfaces S11 corresponding to each light emitting device 101 and a plurality of concave surfaces S12 respectively disposed between the plurality of convex surfaces S11.

The resin layer 220 may include a plurality of convex portions P0 having a convex surface S11 and protruding from the first surface S1. The convex surface S11 and the concave surface S12 may be alternately disposed. The convex portion P0 and the recess portion CO may be alternately disposed.

Each of the light emitting devices 101 may include a reflective sidewall, for example, a body, surrounding the outside of the light emitting chip. The reflective sidewall may have a structure in which a region facing the first surface S1 of the resin layer 220 is open and surrounds the circumference of the light emitting chip. The reflective sidewall may be a part of the light emitting device 101 or may be separately provided as a reflective material. Side surfaces of the light emitting device 101 excluding the emission surface 111 may be formed of a reflective material or a transparent or opaque material. The resin layer 220 may have a refractive index of 1.70 or less, for example, in the range of 1.25 to 1.70. When the refractive index of the resin layer 220 is out of the above range, light extraction efficiency may decrease. Each of the light emitting devices 101 has a bonding portion disposed thereon and may be electrically connected to a pad of the substrate 210. The light emitting chip may emit at least one of blue, red, green, and UV light. The light emitting device 101 may emit at least one of white, blue, red, and green light. The light emitting device 101 may include a phosphor. The light emitting device 101 may include a phosphor layer or a molding member covering the surface of the light emitting chip. The phosphor layer may be a layer to which a phosphor is added, and the molding member may be a transparent resin member having a phosphor or a transparent resin member without impurities such as a phosphor.

The second reflective layer 230 is disposed between the resin layer 220 and the substrate 210 and may be the reflective member of FIG. 1a. A resin layer 220 may be disposed in a region between the first and second reflective layers 240 and 230. The first and second reflective layers 240 and 230 may have the same area as each other and may face upper and lower surfaces of the resin layer 220. Accordingly, the resin layer 220 diffuses the light emitted from the light emitting device 101 and the light reflected by the first and second reflective layers 240 and 230 to guide and emit the light toward the first surface 51.

The first and second reflective layers 240 and 230 may be formed in a single-layer or multi-layer structure. The second reflective layer 230 may include a material that reflects light, for example, a metal or a non-metal material. When the first and second reflective layers 240 and 230 are made of metal, they may include a metal layer such as stainless, aluminum (Al), or silver (Ag), and may include a white resin material or a plastic material when they are non-metallic materials. The first and second reflective layers 240 and 230 may include a white resin material or a polyester (PET) material. The first and second reflective layers 240 and 230 may include at least one of a low reflective film, a high reflective film, a diffuse reflective film, and a regular reflective film. The second reflective layer 230 may be provided as, for example, a regular reflective film for reflecting incident light to the first surface S1.

The first reflective layer 240 may be made of the same material as the second reflective layer 230. The first reflective layer 240 may be made of a material with higher light reflectivity than the material of the second reflective layer 230 or may have a thicker thickness in order to reflect light and reduce transmission loss of light.

A first light blocking portion 35A may be included in the resin layer 220. The first light blocking portion 35A may be disposed between the emission surface 111 of each of the light emitting devices 101 and the first surface S1 or the convex surface S11. The first light blocking portions 35A may be arranged in the same direction as the arrangement direction of the light emitting devices 101 and may be spaced apart from each other. Each of the first light blocking portions 35A may overlap the convex portion P0 in a horizontal direction, and may not overlap the concave portion CO in a horizontal direction. The thickness of the first light blocking portion 35A may be thicker in a region adjacent to a horizontal imaginary straight line through which the central axis of the light emitting device 101 passes than in a far region.

The first light blocking portion 35A may be vertically disposed on the second reflective layer 230 toward the first reflective layer 240 and may have a size to cover each of the light emitting devices 101 from the third surface S3 to the fourth surface S4. Each of the first light blocking portions 35A may be disposed in a circular shape, a matrix shape, or a plurality of ring shapes in front of each of the light emitting devices 101.

The first light blocking portion 35A is disposed in front of each of the light emitting devices 101 to block light emitted from the light emitting devices 101 and to suppress hot spots on the first surface S1. The first light blocking portion 35A refers to the first light blocking portion disclosed in FIG. 1.

Third Embodiment

Figure 10A:
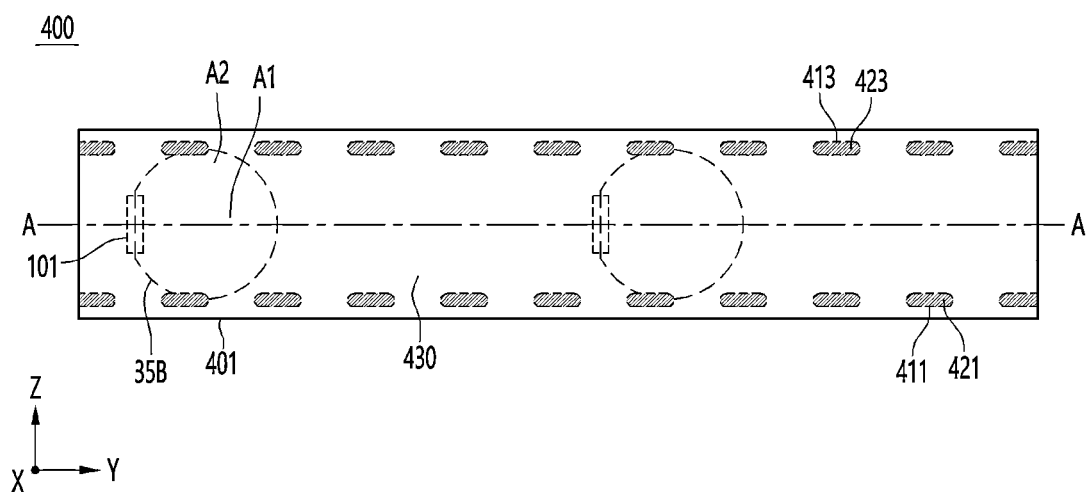
FIG. 10a is an example of a plan view of a lighting device according to a third embodiment of the invention.
Figure 10B:
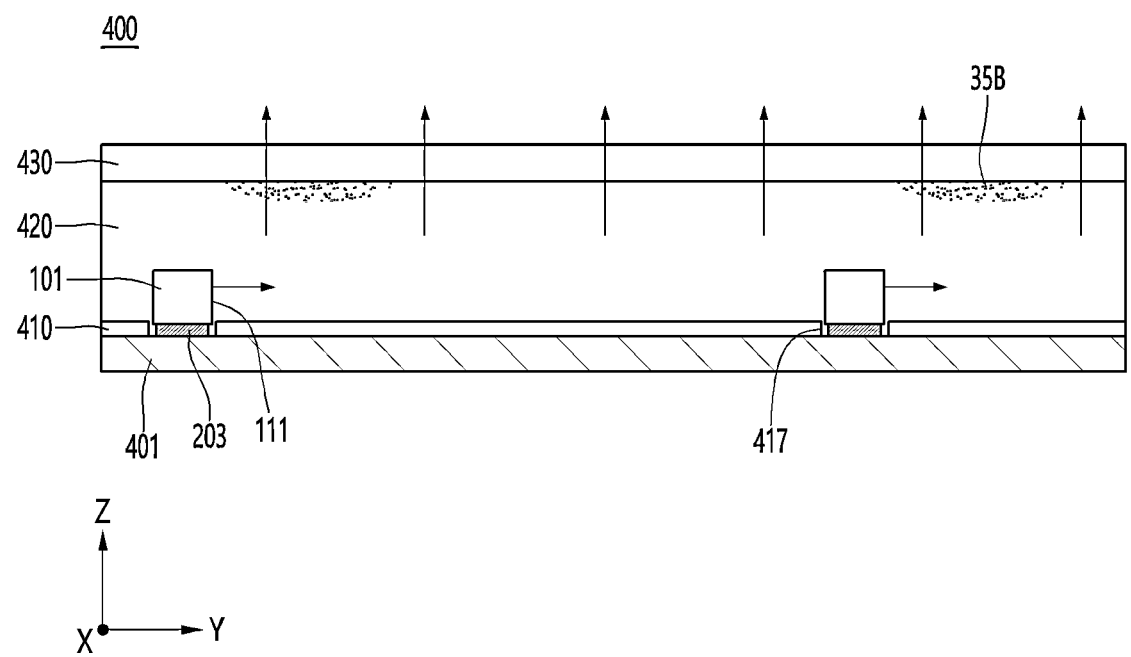

FIGS. 10a and 10b show a lighting device according to a third embodiment, and the description of the above embodiment will be referred to for the same configuration as that of the above-disclosed embodiment.

Referring to FIGS. 10a and 10a, the lighting device 400 may include a substrate 401, a light emitting device 101 disposed on the substrate 401, a resin layer 420 covering the substrate 401 and the light emitting device 101, and an optical member 430 disposed on the resin layer 420. The lighting device 400 may include a reflective member 410 disposed on the substrate 401.

The resin layer 420 seals the light emitting devices 101 between the substrate 401 and the optical member 430. The reflective member 410 includes a plurality of open regions 411 and 413, the plurality of open regions 411 and 413 include a plurality of first and second open regions 411 and 413, and the plurality of first and second open regions 411 and 413 may be arranged in the second direction Y, and may be coupled to portions 421 and 423 of the resin layer 420.

The light emitting devices 101 emit light in the second direction Y. The light emitting devices 101 emit light having the highest intensity in the second direction Y. The light emitting device 101 may have an emission surface 111 from which light is emitted, and the emission surface 111 may be disposed in the third direction Z or in a vertical direction with respect to, for example, a horizontal upper surface of the substrate 401. The emission surface 111 may be a vertical plane or may include a concave surface or a convex surface.

The light emitting device 101 may include a first light emitting device from one end of the substrate 401 and a second light emitting device disposed in an emission direction of the first light emitting device. The first light emitting device and the second light emitting device emit light in the direction of the other end of the substrate 401 or in the second direction Y. The light emitting device 101 is a device having a LED and may include a package in which a light emitting chip is packaged.

The resin layer 420 may include a first light blocking portion 35B. The first light blocking portion 35B is a material of the first light blocking portion described above, and may be a region in which a resin material is discolored by a laser. The first light blocking portion 35B may be exposed on the surface of the resin layer 420, and at least a portion thereof may overlap the light emitting devices 101 in a vertical direction. The first light blocking portion 35B may include a first region A1 extending in the second direction Y in which light is emitted based on the light emitting device 101 and second regions A2 at both sides of the first region A1 and extending in the first direction X orthogonal to the direction Y. The top view shape of the first light blocking portion 35B may be circular dot patterns, circular matrix patterns, or a plurality of ring shapes. The first light blocking portion 35B blocks light emitted from the light emitting device 101 after being reflected by the reflective member 410 and incident light.

The first light blocking portion 35B may face an upper surface of the substrate 401. An interval between the first light blocking portions 35B may be smaller than an interval between the light emitting devices 101. The first light blocking portion 35B may be exposed through an upper surface of the resin layer 420 and may be spaced apart from a side surface of the resin layer 420. A plurality of first light blocking portions 35B may be arranged in the second direction Y. The plurality of first light blocking portions 35B may have the same shape as each other. The first light blocking portion 35B may be divided into a first light blocking portion on the first light emitting device and a second light blocking portion on the second light emitting device. The first and second light blocking portions may be disposed above each of the first and second light emitting devices in an emission direction.

An upper surface of the first light blocking portion 35B may be disposed on the same plane as an upper surface of the resin layer 420. The width in the first direction X of the region adjacent to the light emitting device 101 in the first light blocking portion 35B is small and gradually increases toward the center of the first light blocking portion 35B, and the width of the direction X from the center may increase to maximum. A width in the first direction X may gradually decrease in a direction away from the light emitting device 101 from the center of the first light blocking portion 35B. A region of the first light blocking portion 35B vertically overlapped with the light emitting device 101 may be flat, and a width of the flat region in the first direction may be greater than a length of the light emitting device 101 in the first direction.

In an embodiment of the invention, the process of attaching a separate light blocking pattern to a film or material consumption may be reduced by forming the first light blocking portion 35B having a predetermined thickness in the resin layer 420 with a discolored resin material, and improving the uniformity of light through light blocking.

Figure 14:
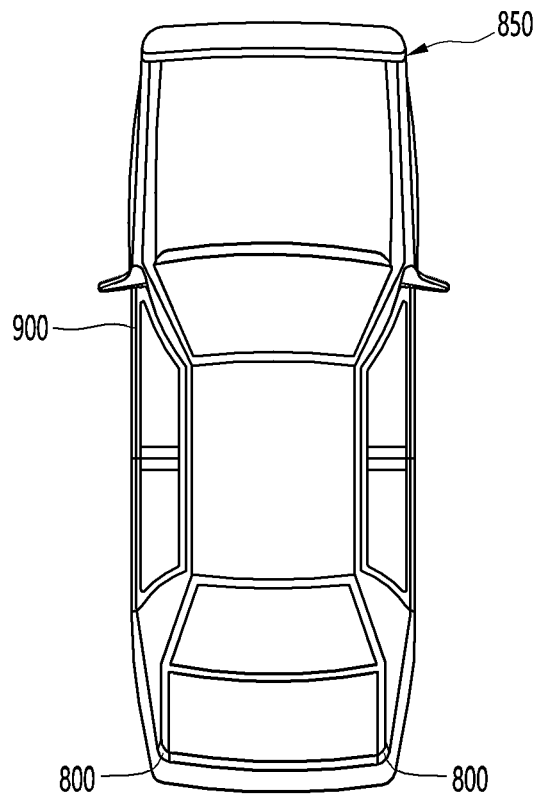
FIG. 14 is a plan view of a vehicle to which a lamp having a lighting device according to an embodiment is applied.
Figure 14:
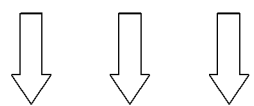
Figure 15:
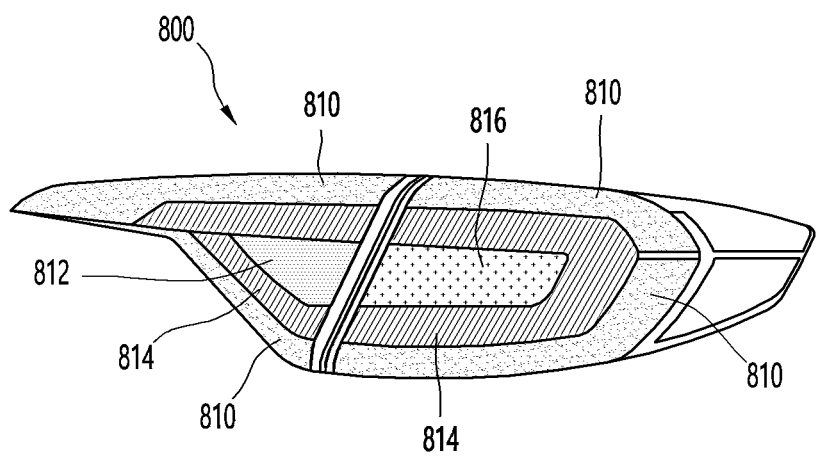
FIG. 15 is a diagram illustrating a lamp having a lighting module or lighting device according to an embodiment.

FIG. 14 is a plan view of a vehicle to which a vehicle lamp to which a lighting device according to an embodiment is applied, and FIG. 15 is a view illustrating a lighting device disclosed in an embodiment or a vehicle lamp having a lighting device.

Referring to FIGS. 14 and 15, in a mobile body or vehicle 900, a front lamp 850 may include one or more lighting modules, and individually control driving timings of these lighting modules to function as normal headlights as well as, When the driver opens the vehicle door, additional functions such as a welcome light or a celebration effect can be provided. The lamps may be applied to daytime running lights, high beams, low beams, fog lights or direction indicators.

In the vehicle 900, the taillight 800 may include a plurality of lamp units 810, 812, 814, and 816 supported by the housing 801. For example, the lamp units 810, 812, 814, and 816 may include a first lamp unit 810 disposed outside, a second lamp unit 814 disposed around the inside of the first lamp unit 810, and third and fourth lamp units 814 and 816 respectively disposed inside of the second lamp unit 814. The first to fourth lamp units 810, 812, 814, and 816 may selectively apply the lighting device disclosed in the embodiment, and a red lens cover or a white lens cover for lighting characteristics of the lamp units 810, 812, 814, and 816 may be disposed outside the lighting device. The lighting device disclosed in the embodiment applied to the lamp units 810, 812, 814, and 816 may emit surface light with a uniform distribution. The first and second lamp units 810 and 812 may be provided in at least one of a curved shape, a straight shape, an angled shape, an inclined shape, and a flat shape, or a mixed structure thereof. One or a plurality of the first and second lamp units 810 and 812 may be disposed in each taillight. The first lamp unit 810 may be provided as a tail light, the second lamp unit 812 may be provided as a brake light, and the third lamp unit 814 may be provided as a reversing light. The fourth lamp unit 816 may serve as a turn signal lamp.

The structure and location of these lighting lamps may be changed. Features, structures, effects, etc. described in the embodiments above are included in at least one embodiment of the invention, and are not necessarily limited to only one embodiment. Furthermore, the features, structures, effects, etc. illustrated in each embodiment may be combined or modified with respect to other embodiments by those skilled in the art in the field to which the embodiments belong. Therefore, contents related to these combinations and variations should be construed as being included in the scope of the invention.

In addition, although described based on the embodiments above, this is only an example, not limiting this invention, it will be apparent to those skilled in the art that various modifications and applications not illustrated above may be made without departing from the essential characteristics of this embodiment. For example, each component specifically shown in the embodiment may be modified and implemented. And the differences related to these modifications and applications should be construed as being included in the scope of the invention as defined in the appended claims.

The invention claimed is:

1. A lighting device comprising:
a substrate;
a plurality of light emitting devices disposed on the substrate and emitting light in at least a first direction;
a resin layer sealing the plurality of light emitting devices;
an optical member disposed on the resin layer; and
wherein the resin layer includes a first light blocking portion integrally formed with the resin layer and having a transmittance lower than that of the resin layer on an emission side region of each of the plurality of light emitting devices, and
wherein the resin layer includes a fourth light blocking portion disposed around the light emitting devices.

2. The lighting device of claim 1, wherein the first light blocking portion has an area larger than an area of each of the light emitting devices on a region facing to an emission surface of each of the light emitting devices.

3. The lighting device of claim 1, wherein the resin layer includes a second light blocking portion disposed on a region that does not overlap with each of the light emitting devices and the first light blocking portion in a vertical direction, and
wherein an upper surface of the second light blocking portion is exposed to an upper surface of the resin layer.

4. The lighting device of claim 1,
wherein the optical member includes a third light blocking portion disposed on a region that does not overlap with each of the light emitting devices and the first light blocking portion in a vertical direction.

5. A lighting device comprising:
a substrate;
a plurality of light emitting devices disposed on the substrate and emitting light in at least a first direction;
a resin layer sealing the plurality of light emitting devices;
an optical member disposed on the resin layer; and
a reflective member disposed between the substrate and the resin layer,
wherein the resin layer includes a first light blocking portion integrally formed with the resin layer and having a transmittance lower than that of the resin layer on an emission side region of each of the plurality of light emitting devices,
wherein the resin layer includes a second light blocking portion disposed in a region that does not overlap with the light emitting devices and the first light blocking portions in a vertical direction,
wherein the optical member includes a third light blocking portion disposed in a region that does not overlap with the light emitting devices and the first light blocking portions in the vertical direction,
wherein an upper surface of the second light blocking portion is exposed to an upper surface of the resin layer, and
wherein the resin layer includes a fourth light blocking portion disposed around the light emitting devices.

6. The lighting device of claim 1, wherein the optical member is a reflective layer,
wherein the resin layer is disposed between the reflective layer and the reflective member, wherein the first light blocking portion is disposed between an emission surface of each of the light emitting devices and a side surface of the resin layer, wherein each of the substrate, the resin layer, and the reflective layer has a plurality of convex portions in which the emission-side region of each of the light emitting devices is convex outward.

7. The lighting device of claim 1, wherein the first light blocking portion is exposed on an upper surface of the resin layer, and at least a portion of the first light blocking portion overlaps each of the light emitting devices in a vertical direction, wherein the first light blocking portion includes a first region extending from each of the light emitting devices in a direction toward an emission side of each of the light emitting devices, and a second region extending in a second direction on both sides of the first region.

8. The lighting device of claim 1, wherein the first light blocking portion has a transmittance of 50% or less for light emitted from the light emitting device, wherein a difference between transmittance and reflectance of the first light blocking portion is in a range of 1% to 30%.

9. The lighting device of claim 1, wherein the first light blocking portion is made of a white resin material.

10. The lighting device of claim 1, wherein the first light blocking portion is formed of a same resin material as the resin layer.

11. The lighting device of claim 1, wherein the first light blocking portion has a thickness of a region disposed on a same straight line as a center of the light emitting device, which is thicker than a thickness of an outer region, wherein the optical member includes at least one of a diffusion agent, a phosphor, and ink particles.

12. A lamp comprising at least one of a tail light, a turn signal light, a reversing light, a brake light, and a daytime running light, wherein the lamp is a vehicle lamp having a lighting device according to claim 1.

13. A lighting device comprising:

a substrate;

a plurality of light emitting devices disposed on the substrate and emitting light in at least a first direction;

a resin layer sealing the plurality of light emitting devices;

an optical member disposed on the resin layer; and a reflective member disposed between the substrate and the resin layer, wherein the resin layer includes first light blocking portions integrally formed with the resin layer and having a transmittance lower than that of the resin layer in an emission side region of each of the plurality of light emitting devices, wherein the first light blocking portions are disposed inside the resin layer spaced apart from a surface of the resin layer, and wherein the first light blocking portions are regions in the resin layer in which a material of the resin layer is discolored.

14. The lighting device of claim 13, wherein the first light blocking portions are formed within the resin layer without an interface with the material of the resin layer.

15. The lighting device of claim 14, wherein the first light blocking portions are the regions where the resin layer is discolored to white.

16. The lighting device of claim 13, wherein the first light blocking portions have a refractive index higher than that of the resin layer and are regions in which the material of the resin layer is discolored.

17. The lighting device of claim 13, wherein each of the first light blocking portions is a discolored region made of the same material as that of the resin layer.

18. The lighting device of claim 17, wherein each of the first light blocking portions has an area larger than an area of each of the light emitting devices in a region facing an emission surface of each of the light emitting devices.

19. The lighting device of claim 17, wherein the resin layer includes second light blocking portions disposed in a region that does not overlap the light emitting devices and the first light blocking portions in a vertical direction, wherein an upper surface of each of the second light blocking portions is exposed to an upper surface of the resin layer, and wherein the second light blocking portions are regions in which the same material as the material of the resin layer is discolored.

20. The lighting device of claim 17, wherein the resin layer includes a fourth light blocking portion disposed around the light emitting devices, and wherein the fourth light blocking portion is a region in which the same material as the material of the resin layer is discolored.

\* \* \* \* \*